US006608497B1

(12) United States Patent
Adney et al.

(10) Patent No.: US 6,608,497 B1
(45) Date of Patent: Aug. 19, 2003

(54) APPARATUS AND METHOD FOR ALLOWING TESTING OF SEMICONDUCTOR DEVICES AT DIFFERENT TEMPERATURES

(75) Inventors: Daniel R. Adney, Phoenix, AZ (US); Ignacio A. Mendiola, Jr., Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/978,535

(22) Filed: Oct. 15, 2001

(51) Int. Cl.[7] .............................................. G01R 31/02
(52) U.S. Cl. ................................... 324/760; 324/158.1
(58) Field of Search ................................ 324/760, 765, 324/158.1; 165/80.1–80.5; 361/687–691

(56) References Cited

U.S. PATENT DOCUMENTS

| | | | | |
|---|---|---|---|---|
| 4,820,976 A | * | 4/1989 | Brown ........................ 324/760 |
| 4,870,355 A | * | 9/1989 | Kufis et al. .................. 324/760 |
| 5,550,482 A | * | 8/1996 | Sano .......................... 324/758 |
| 6,288,561 B1 | * | 9/2001 | Leedy ......................... 324/760 |
| 6,437,593 B1 | * | 8/2002 | Ito et al. ..................... 324/765 |

* cited by examiner

Primary Examiner—Kamand Cuneo
Assistant Examiner—Tung X. Nguyen
(74) Attorney, Agent, or Firm—Weiss, Moy & Harris, P.C.

(57) ABSTRACT

An apparatus and method for maintaining a uniform temperature to allow for the environmental testing of an integrated circuit. A contactor assembly is used for connecting the integrated circuit to a piece of testing equipment. The contactor assembly is able to altering a temperature of the integrated circuit. A porting assembly is coupled to the testing equipment and to the contactor assembly. The porting assembly transfers a gas to the contactor assembly in order to allow the contactor assembly to alter the temperature of the integrated circuit.

20 Claims, 8 Drawing Sheets

APPARATUS AND METHOD FOR ALLOWING TESTING OF SEMICONDUCTOR DEVICES AT DIFFERENT TEMPERATURES

FIELD OF THE INVENTION

This invention relates to semiconductor devices and, more specifically, to an apparatus and method for the post production testing of semiconductor devices at different temperatures.

BACKGROUND OF THE INVENTION

The testing of an integrated circuit is a very important step in the production of quality semiconductor devices. A number of different test may be performed on the integrated circuit to identify whether the circuit is operating correctly and whether or not the circuit is likely to malfunction in the future.

One type of testing that is done to ensure reliability is environmental testing. Environmental testing of integrated circuits entails the testing of these circuits at elevated and/or reduced temperatures. When testing integrated circuits at different temperatures, it is desirable to maintain a constant and uniform temperature on each circuit that is being tested. If the temperature on each integrated circuit is not uniform, the test results will differ significantly for the different circuits.

Many efforts have been made to provide uniform temperature testing of integrated circuits. However, presently no one has been able to provide an effective way for the uniform post production temperature testing of semiconductor devices. This is especially true for post production parallel strip testing of semiconductor devices.

Therefore, a need existed to provide a device and method that will maintain a uniform temperature of semiconductor devices mounted on a test board.

SUMMARY OF THE INVENTION

An apparatus and method for maintaining a uniform temperature to allow for the environmental testing of an integrated circuit. A contactor assembly is used for connecting the integrated circuit to a piece of testing equipment. The contactor assembly is able to altering the temperature of the integrated circuit. A porting assembly is coupled to the testing equipment and to the contactor assembly. The porting assembly transfers a gas to the contactor assembly in order to allow the contactor assembly to alter the temperature of the integrated circuit.

The present invention is best understood by reference to the following detailed description when read in conjunction with the accompanying drawings.

DESCRIPTION OF THE DRAWINGS

Common reference numerals are used throughout the drawings and detailed description to indicate like elements.

DETAILED DESCRIPTION

Figure 1:
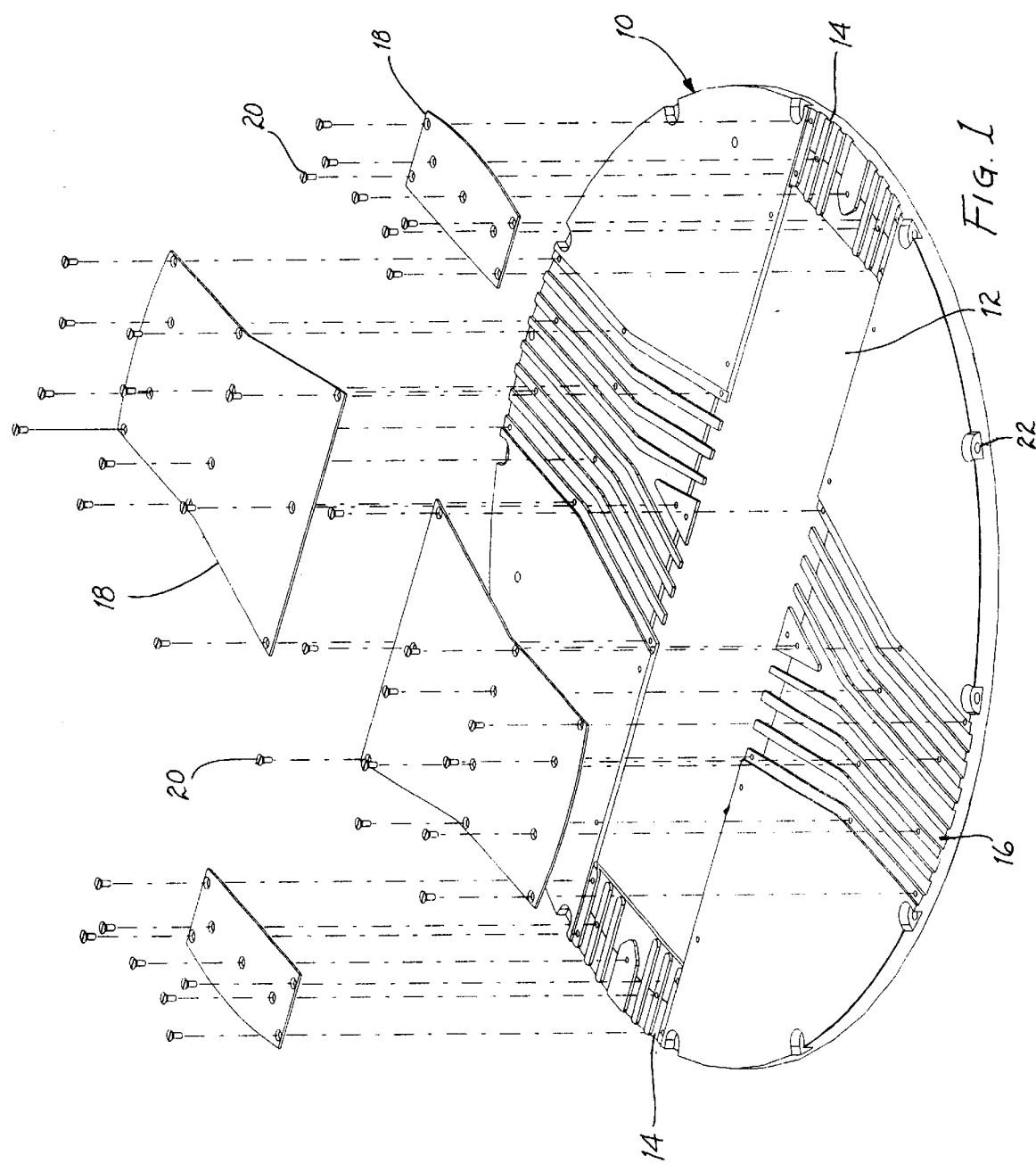
FIG. 1 is an exploded elevated perspective view of one embodiment of a porting tray used in the apparatus of the present invention.

Referring to FIG. 1, one embodiment of a porting tray 10 used in the apparatus of the present invention is shown. As stated above, the present invention allows for the testing of semiconductor devices at different temperatures. The porting tray 10 is used to interface between an integrated circuit formed on a semiconductor wafer and a testing machine like an integrated circuit tester and the like. It should be noted that the listing of the above mentioned testing apparatuses is used as an example and should not be seen as to limit the scope of the present invention.

The porting tray 10 is designed to be able to transfer a gas at different temperatures to the integrated circuits that are to be tested. The testing equipment on which the porting tray 10 is coupled to will then be able to perform testing of the integrated circuit elevated and/or reduced temperatures. The porting tray 10 will be able to distribute the gas in a uniform fashion. Thus, the porting tray 10 will be able to maintain a constant and uniform temperature on each integrated circuit being tested.

The porting tray 10 is generally constructed out of a solid piece of material. The material must be able to withstand a wide variety of temperature ranges without altering the properties of the material. In accordance with one embodiment of the present invention, the porting tray 10 is constructed out of stainless steel. The porting tray 10 is configured to be adapted to a specific piece of testing equipment. Thus, the size and shape of the porting tray 10 varies depending on the specific piece of test equipment the porting tray 10 will be coupled to. In the embodiment depicted in FIG. 1, the porting tray 10 is circular in shape. However, this should not be seen as to limit the scope of the present invention.

The porting tray 10 will have a void area 12. The void area 12 is where a contactor assembly will be positioned. The size and geometry of the void area 12 will be based on the contactor assembly that will be positioned in the void area 12. In the embodiment depicted in FIG. 1, the void area 12 is centrally located in the porting tray 10. The void area 12 is also rectangular in shape. However, the size and the location of the void area 12 should not be seen as to limit the scope of the present invention.

The porting tray 10 will have a plurality of first channels 14. The first channels 14 run from each side edge of the void area 12 to the outer perimeter of the porting tray 10. The first channels 14 will allow a gas to be transferred from an outside source to the void area 12 where a contactor assembly will be positioned. In order to provide a more uniform distribution of the gas to larger void areas 12, a plurality of second channels 16 may run from an upper and lower edge section of the void area 12 to the outer perimeter of the porting tray 10. The second channels 16 will allow a gas to be transferred in a more uniform fashion to the contactor assembly which will be positioned in the void area 12.

The channels 14 and/or 16 may be formed from the top surface of the porting tray as shown in FIG. 1. Alternatively, the channels 14 and/or 16 may be machined through the thickness of the porting tray 10. However, the drilling of the channels 14 and/or 16 is more difficult and more costly to perform. By forming the channels 14 and/or 16 on the top surface, the porting tray 10 is easier and cheaper to construct. If the channels 14 and/or 16 are formed on the top layer of the porting tray 10, a cover 18 will be coupled to the porting tray 10. The cover 18 is placed over the channels 14 and/or 16 and is used to direct the gas flow through the channels 14 and/or 16. The cover 18 should be constructed out of a material whose properties will not vary through a wide temperature range. In accordance with one embodiment of the present invention, the cover 18 is constructed out of stainless steel. However, the listing of this material should not be seen as to limit the scope of the present invention.

The cover 18 may be permanently or removably coupled to the porting tray 10. In the embodiment depicted in FIG. 1, the cover 18 is removably coupled. If the cover 18 is removably coupled, a plurality of connectors 20 are used to couple the cover 18 to the porting tray 10. The connectors may be screws, rivets, or the like. However, the listing of the above mentioned connectors 20 are just an example and should not be seen as to limit the scope of the present invention.

The porting tray 10 will have a plurality of smaller openings 22. The openings 22 are located along the outer perimeter of the porting tray 10. The openings 22 are used to couple the porting tray 10 to the testing equipment.

Figure 2:
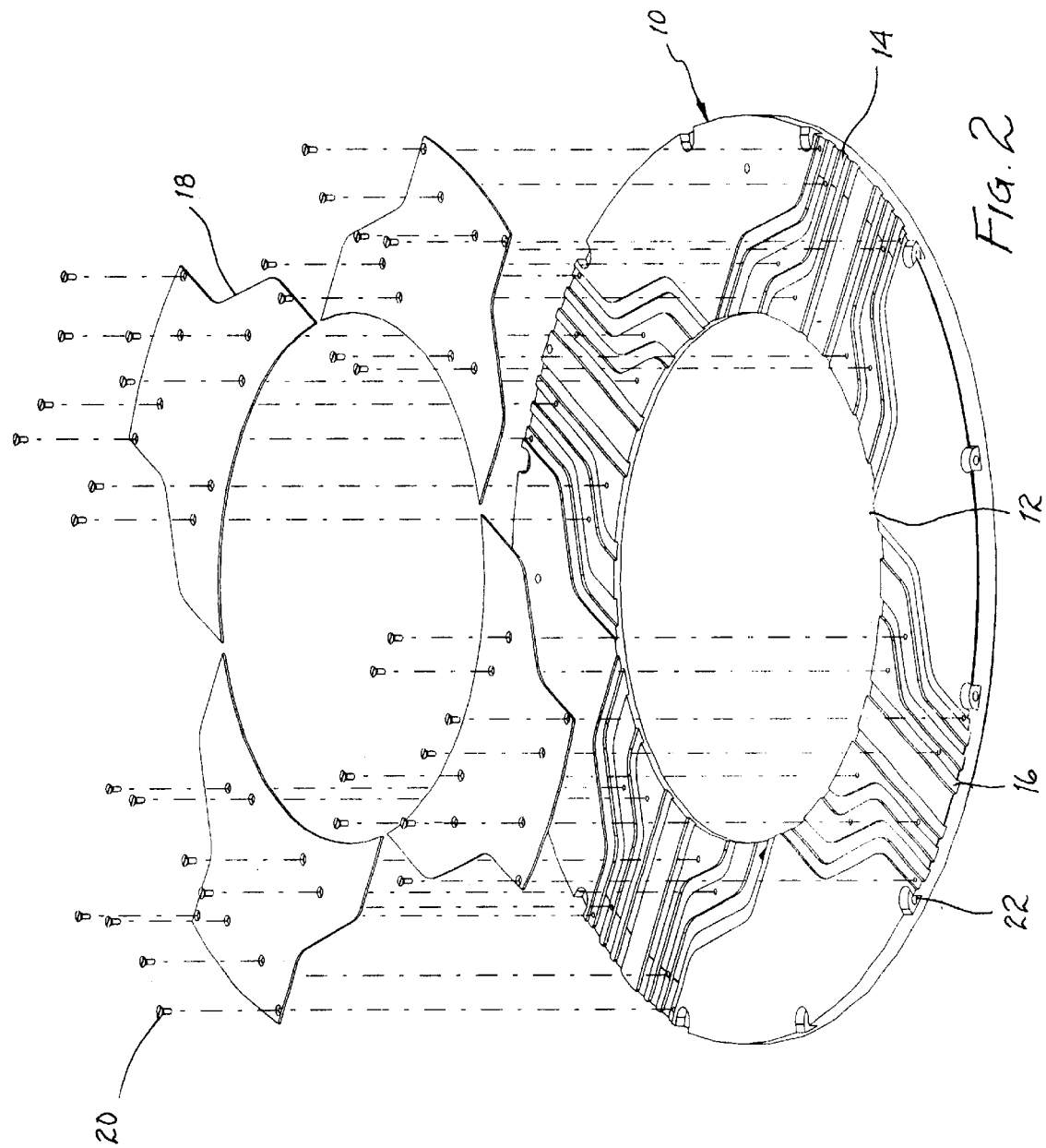
FIG. 2 is an exploded elevated perspective view of another embodiment of a porting tray used in the apparatus of the present invention.

Referring now to FIG. 2, another embodiment of the porting tray 10 is shown. The porting tray 10 in FIG. 2 is very similar to the embodiment depicted in FIG. 1. The main differences are that the geometry and shape of the void area 12, the channels 14 and 16, and the cover 18 are different from those shown in FIG. 1. The void area 12 is different in size and shape in order to accommodate different types of test equipment like a prober. Since the void area 12 is different in size and shape, the channels 14 and 16 need to be modified in order to more evenly distribute the gas to the contactor assembly. The cover 18 is also modified to properly and fully cover the modified channels 14 and 16.

Figure 3:
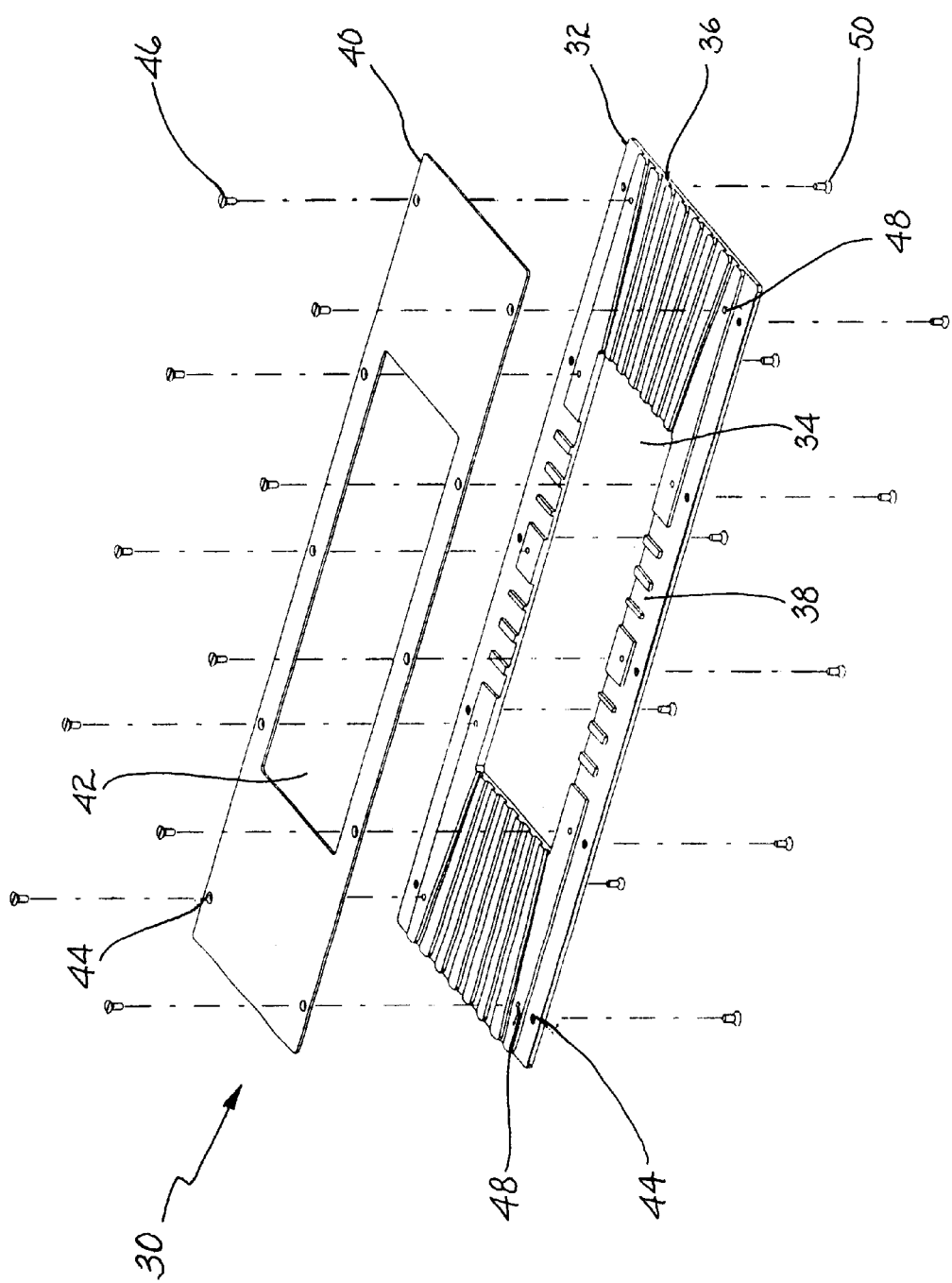
FIG. 3 is an exploded elevated perspective view of one embodiment of a porting insert used in the apparatus of the present invention.

Referring now to FIG. 3, one embodiment of a porting insert 30 is shown. The porting insert 30 is used to distribute the gas from the porting tray 10 (FIGS. 1 and 2) to a contactor plate. The porting tray 30 can be designed in a variety of different shapes and sizes in order to accommodate a wide variety of contactor plates. The porting tray 30 should be constructed out of a material whose properties do not change with varying temperatures. In accordance with one embodiment of the present invention, the porting insert 30 is constructed out of stainless steel. However, this should not be seen as to limit the scope of the present invention.

The porting insert 30 will have a bottom plate 32. The bottom plate 32 will have a contactor plate opening 34. The contactor plate opening 34 is designed to allow a contactor plate to securely fit within the contactor plate opening 34. A plurality of channels 36 run from the side edge of the bottom plate 32 to the contactor plate opening 34. The channels 36 will be aligned with the channels 14 of the porting tray 10 when the porting insert 30 is positioned in the void area 12 of the porting tray 10. A second set of channels 38 may be used to more evenly distribute the gas to the contactor plate. The second set of channels 38 run from the top edge and the bottom edge of the bottom tray 32 to the contactor plate opening 34. The second set of channels 38 will be aligned with the channels 16 of the porting tray 10 when the porting insert 30 is positioned in the void area 12 of the porting tray 10.

A top plate 40 is coupled to the bottom plate 32. The top plate 40 is used to cover the channels 36 and/or 38 and to direct the gas coming from the porting tray through the channels 36 and/or 38. The top plate 40 will have an opening 42. The opening 42 will be similar in size and shape to the contactor plate opening 34 of the bottom plate 32. When the top plate 40 and the bottom plate 32 are coupled together, the opening 42 will be aligned with the contactor plate opening 34.

In the embodiment depicted in FIG. 3, the top plate 40 and the bottom plate 32 are removably coupled together. The top plate 40 and the bottom plate 32 both have a plurality of holes 44 located around the outer perimeter. When the top plate 40 is properly positioned on the bottom plate 32, the holes 44 on the top plate will be in axial alignment with the holes 44 of the bottom plate 32. A plurality of connectors 46 may then be used to coupled the top plate 40 and the bottom plate 32 together. The connectors may be screw, rivets, and the like. It should be noted that the above mentioned types of connectors 46 are used as an example and should not be seen as to limit the scope of the present invention.

The top plate 40 and the bottom plate 32 will have a second set of holes 48. When the top plate 40 is properly positioned on the bottom plate 32, the holes 48 on the top plate will be in axial alignment with the holes 48 of the bottom plate 32. These second set of holes 48 are used to couple the porting insert 30 to the porting tray 10. A plurality of connectors 50 may then be used to coupled the porting insert 30 to the porting tray 10. Once again, it should be noted that many different types of connectors 50 may be used.

Figure 4:
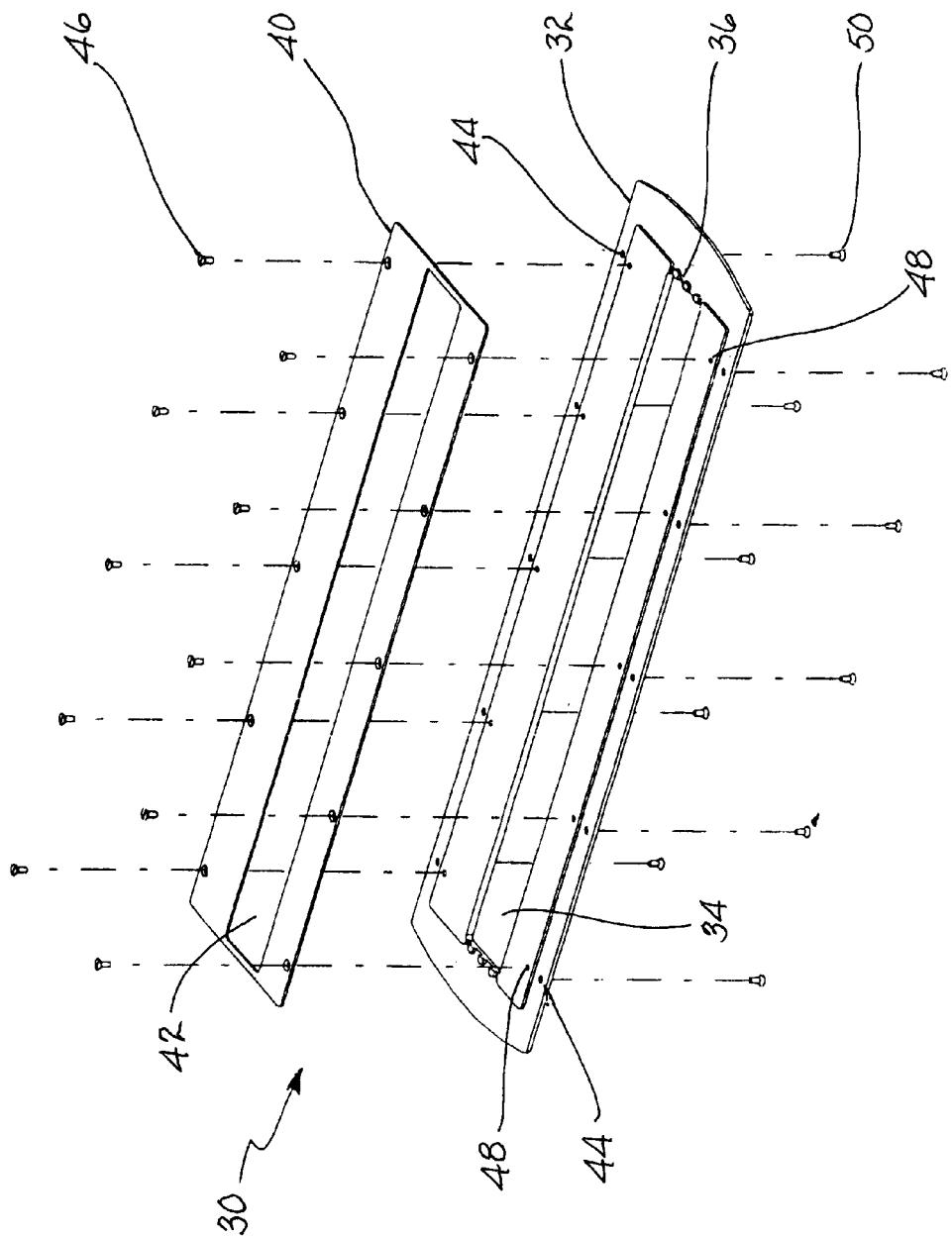
FIG. 4 is an exploded elevated perspective view of another embodiment of a porting insert used in the apparatus of the present invention.

Referring now to FIG. 4, another embodiment of the porting insert 30 is shown. The porting insert of FIG. 4 is very similar to the porting insert 30 depicted in FIG. 3. The main difference is that the size and shape of the opening 42 of top plate 40 and the contactor plate opening 34 of the bottom plate 32. The size and shape of the opening 42 and the contactor plate opening 34 is different in order to accommodate a different size contactor plate. The porting insert 30 of FIG. 4 also differs from previous embodiments in that the porting insert 30 only has channels 36 which run from the side edge of the bottom plate 32 to the contactor plate opening 34.

Figure 5:
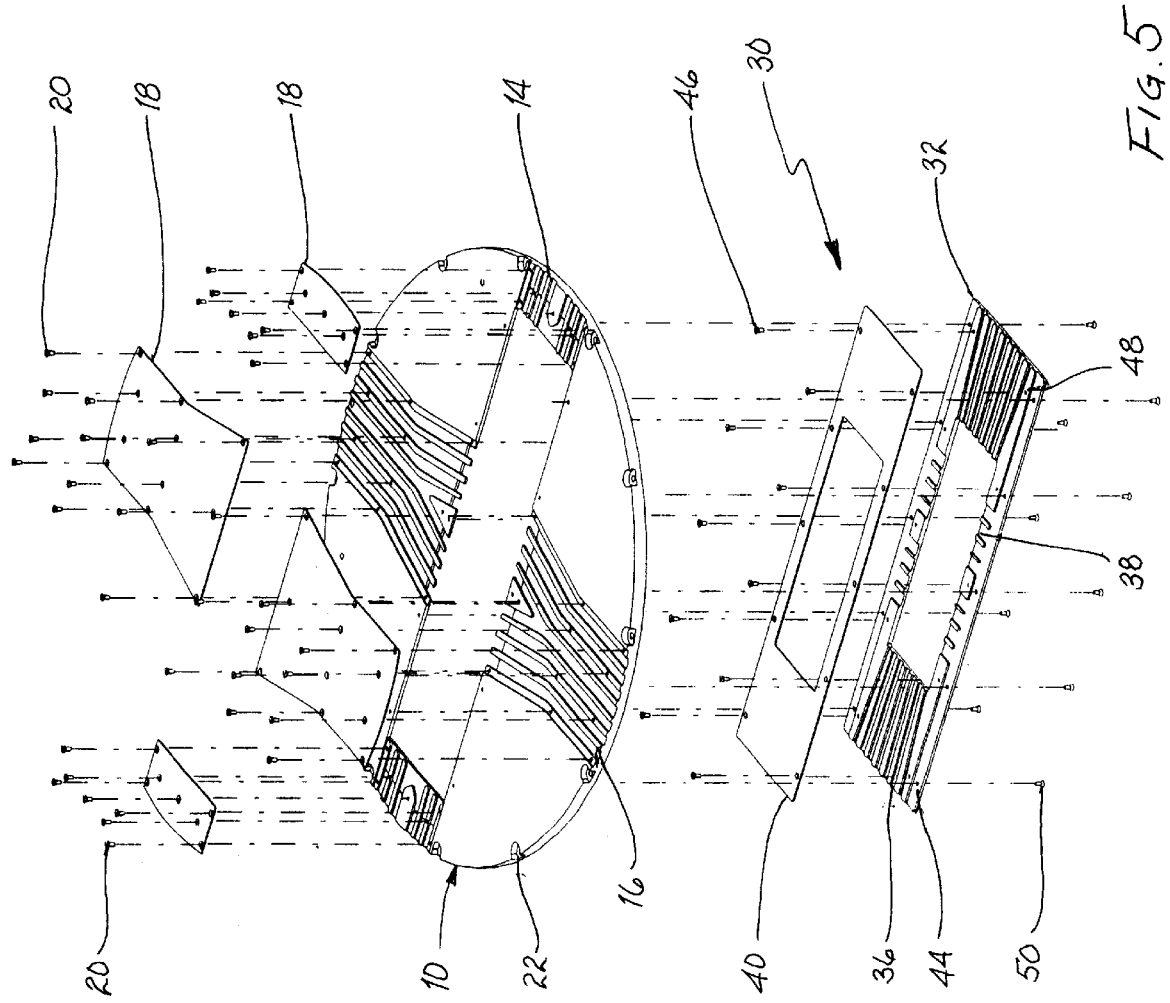
FIG. 5 is an exploded elevated perspective view of one embodiment of the combination of the porting insert and the porting tray used in the apparatus of the present invention.

Referring now to FIG. 5, an exploded view of the porting tray 10 and the porting insert 30 is shown. The porting insert 30 will be positioned within the void area 12 of the porting tray 10. When properly positioned, the channels 36 of the porting insert 30 will be aligned with the channels 14 of the porting tray 10. Furthermore, if the porting insert 30 has a second set of channels 38, the channels 38 will be aligned with the channels 16 of the porting tray 10.

As stated above, the top plate 40 and the bottom plate 32 of the porting insert 30 will have a second set of holes 48. When the top plate 40 is positioned on the bottom plate 32, the holes 48 on the top plate will be in axial alignment with the holes 48 of the bottom plate 32. These second set of holes 48 are used to couple the porting insert 30 to the porting tray 10. When the porting insert 30 is properly aligned in the void area 12 of the porting tray 10, the holes 48 will be in axial alignment with a set of openings in the porting tray 10. A plurality of connectors 50 may then be used to coupled the porting insert 30 to the porting tray 10. The connectors 50 may be screws, rivets, and the like. Once again, it should be noted that the listing of these different types of connectors 50 are used as an example and should not be seen as to limit the scope of the present invention.

Figure 6:
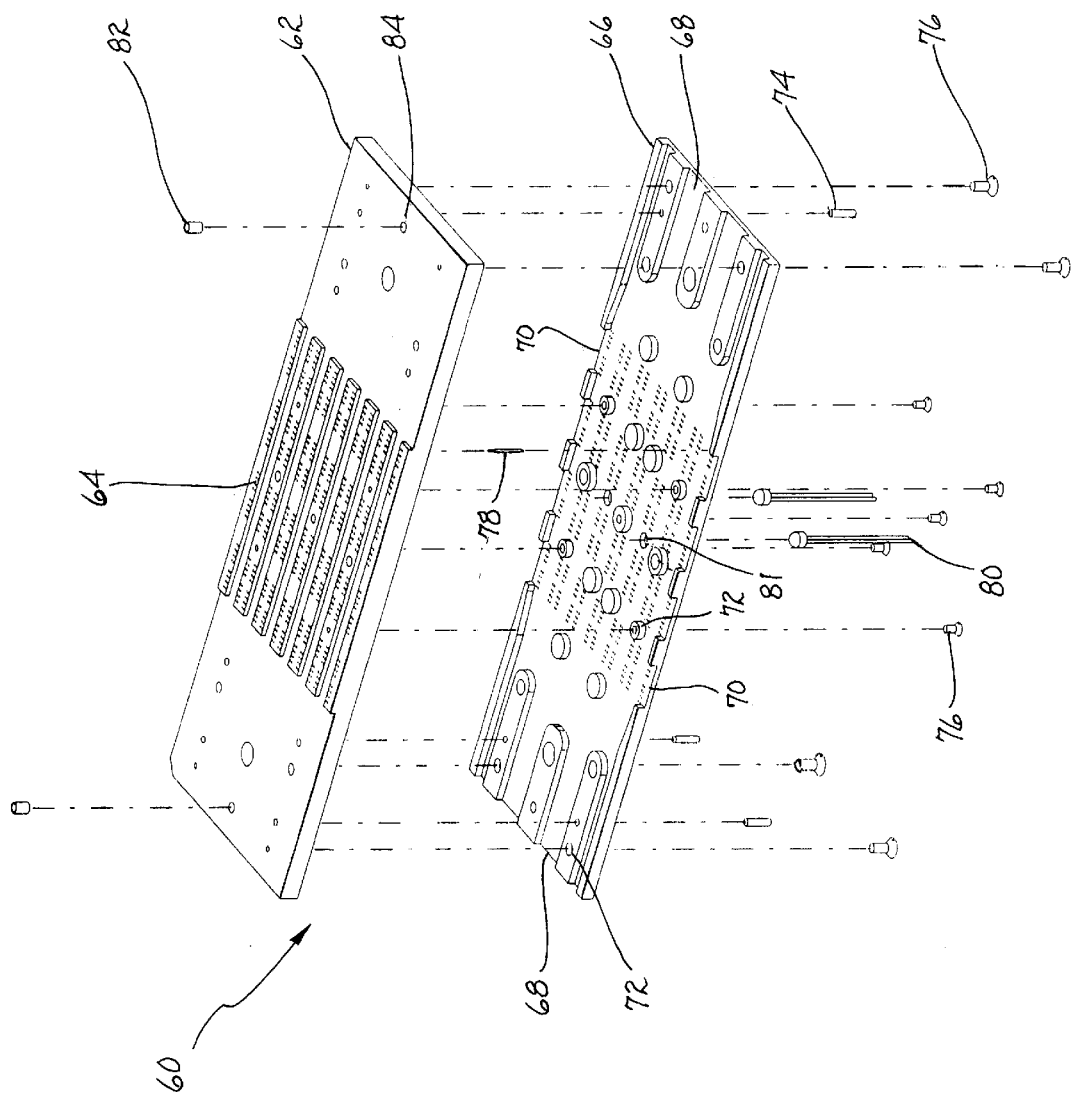
FIG. 6 is an exploded elevated perspective view of one embodiment of a contactor plate used in the apparatus of the present invention.

Referring now to FIG. 6, a contactor plate 60 is shown. The contactor plate 60 has a top contactor plate 62. The top contactor plate 62 will have a plurality of sockets 64. The sockets 64 are used for the insertion of the integrated circuit to be tested. The contactor plate 60 will also have a bottom plate 66 which is coupled to the top plate 62. The bottom plate 66 will have a first set of channels 68. The channels 68 are formed on each side edge of the bottom plate 66. When the contactor plate 60 is positioned in the porting insert 30, the channels 68 will be aligned with the channels 36 of the porting insert and the channels 14 of the porting tray 10. The bottom plate 66 may also have a second set of channels 70 positioned on the top and bottom edges of the bottom tray. When the contactor plate 60 is positioned in the porting insert 30, the second set of channels 70 will be aligned with the second set of channels 38 of the porting insert 30 and the channels 16 of the porting tray 10.

The top contactor plate 62 is generally removably coupled to the bottom plate 66. In accordance with one embodiment, the top plate 62 and the bottom plate 66 will have a plurality of openings 72 around the outer edges. When the top contactor plate 62 is properly aligned with the bottom plate 66, the openings 72 of the top contactor plate 62 and the bottom plate 66 will be in axial alignment. In order to aid in the alignment of the top contactor plate 62 and the bottom plate 66, one or more alignment devices 74 may be used. The alignment devices 74 may be a male/female alignment device where a male peg is coupled to either the top contactor plate 62 or the bottom plate 66. A female alignment opening is formed on the opposite plate. When the male peg is inserted into the proper female opening, the top contactor plate 62 and the bottom plate 66 will be in proper alignment. It should be noted that this is just one example of an alignment device 74 and should not be seen as to limit the scope of the present invention.

Once the top contactor plate 62 and the bottom plate 66 are properly aligned, they are coupled together. In accordance with one embodiment of the present invention, a plurality of connectors 76 are used to coupled the top contactor plate 62 to the bottom plate 66. Once again, it should be noted that many different types of connectors 76 may be used.

Held between the top contactor plate 62 and the bottom plate 66 is a plurality of contactor devices 78. The contactor devices 78 are used to make contact between the integrated circuit positioned in the sockets 64 and a printed circuit board positioned on the testing equipment. In accordance with one embodiment of the present invention, the contactors 78 are double ended spring contacts. However, this is only an example, and should not be seen as to limit the scope of the present invention.

Also positioned between the top contactor plate 62 and the bottom plate 66 is one or more thermal sensors 80. The thermal sensor 80 is used to measure and communicate the temperature within the contactor plate 60. The thermal sensor 80 would allow an individual to increase or decrease the temperature of the gas going into the contactor plate 60 in order to match the requirements of the temperature test.

In order to measure the temperature, an opening 81 is made in the bottom plate 66. The thermal sensor 80 will be inserted into the opening 81 and into the contactor plate 60. A bottom section of the thermal sensor 80 will extend downward and out of the contactor plate 60. The bottom section of the thermal sensor 80 will be coupled to a device which will monitor the temperature measured and communicated by the thermal sensor 80.

The top contactor plate 62 may have one or more alignment pins 82 coupled thereto. In accordance with one embodiment of the present invention, the alignment pin 82 is inserted into an opening 84 formed within the top plate 62. The alignment pin 82 is used as an optical alignment for the test equipment.

Figure 7:
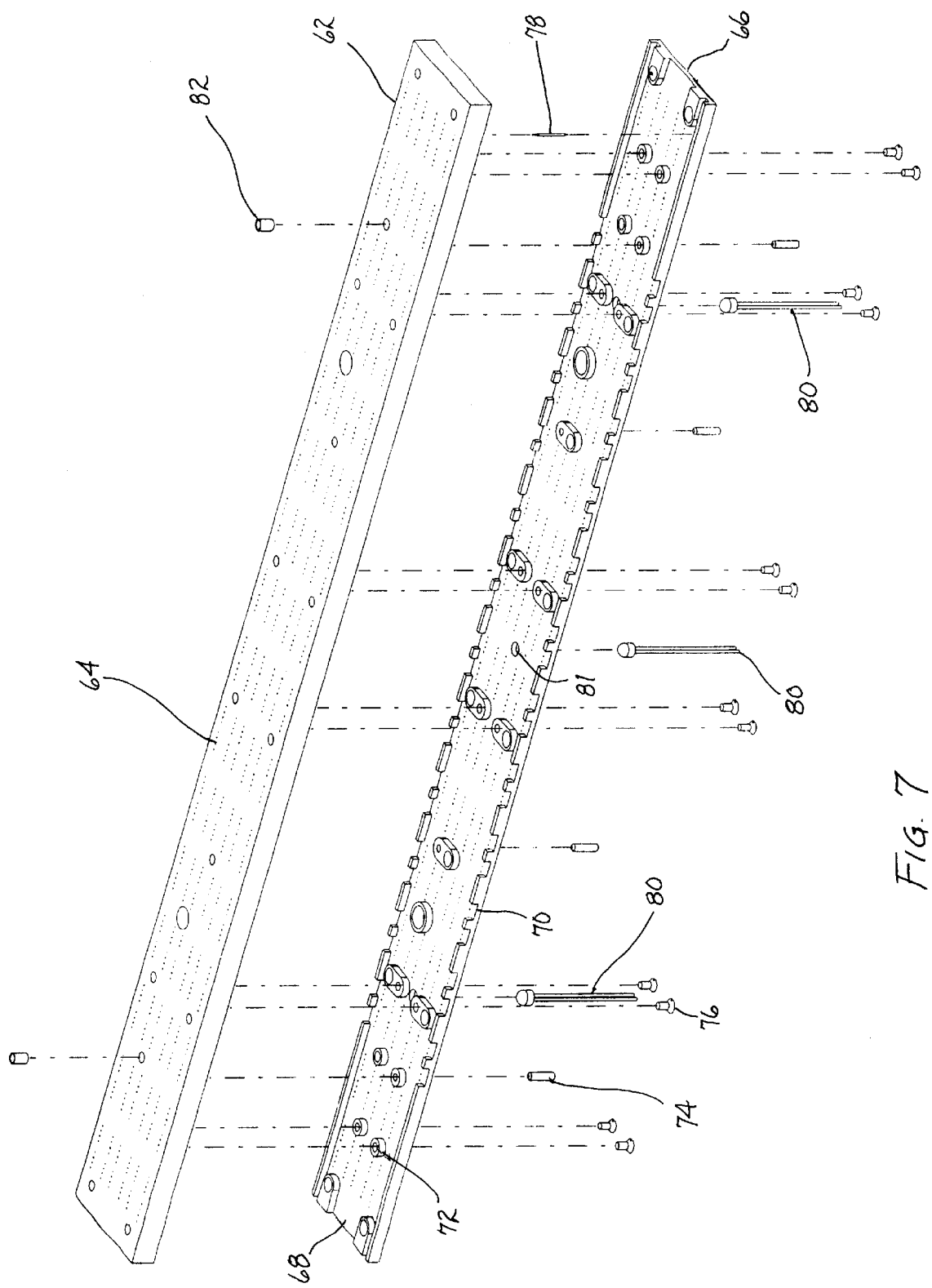
FIG. 7 is an exploded elevated perspective view of another embodiment of a contactor plate used in the apparatus of the present invention.

Referring now to FIG. 7, another embodiment of the contactor plate 60 is shown. The contactor plate 60 of FIG. 7 is very similar to the contactor plate 60 depicted in FIG. 6. The main difference is that the size and shape of the contactor plate 60. The size and shape of the contactor plate 60 is different in order to accommodate different type of integrated circuit.

Figure 8:
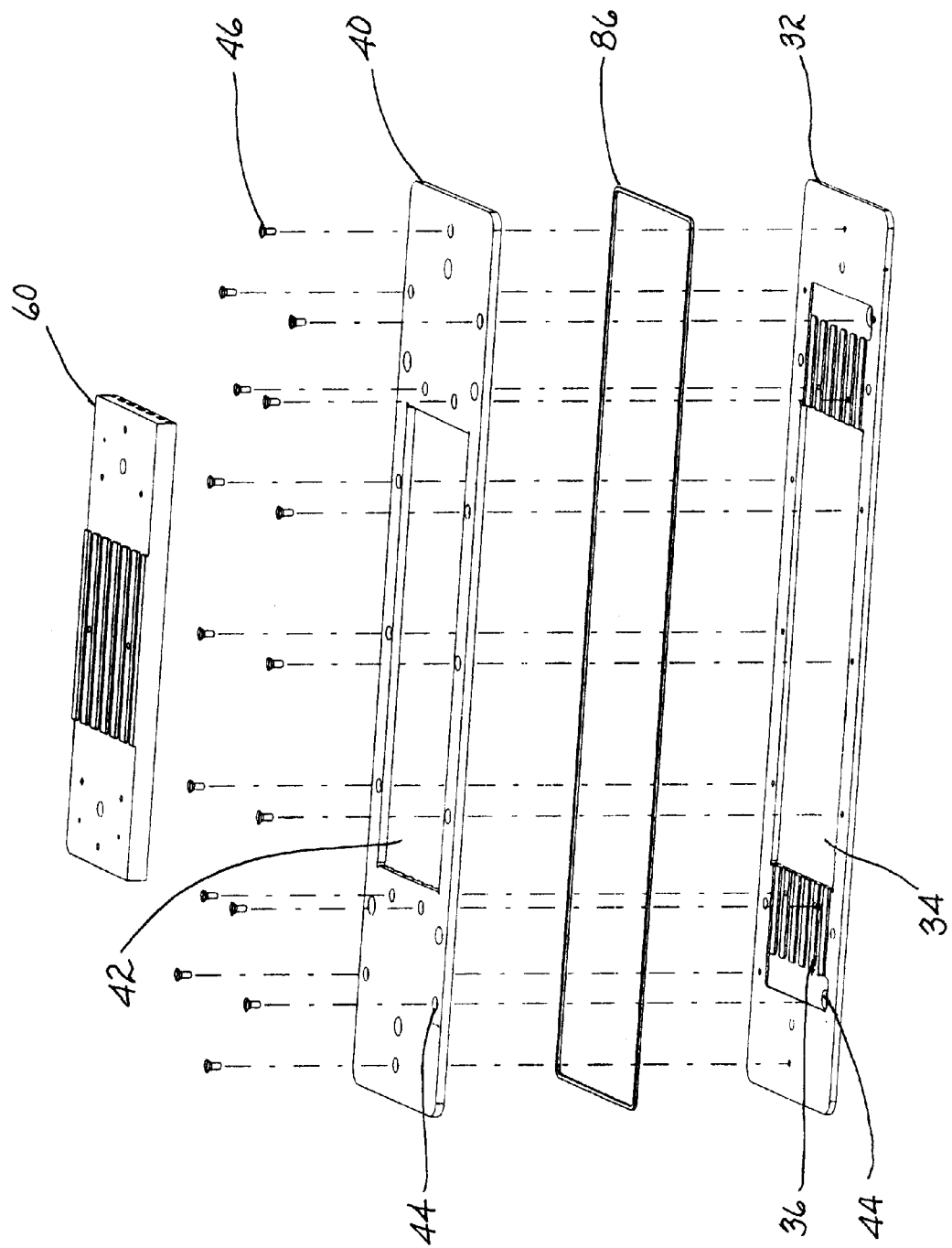
FIG. 8 is an exploded elevated perspective view of one embodiment of the combination of the contactor plate and the porting insert used in the apparatus of the present invention.

Referring to FIG. 8, an exploded view of the one embodiment of the combination of the contactor plate 60 and the porting insert 30 used in the temperature testing apparatus of the present invention is shown. The contactor plate 60 is positioned so that it fits securely in the porting insert 30. The porting insert 30 will have an opening formed by the alignment of the opening 42 of the top plate 40 and the opening 34 of the bottom plate 32. In the embodiment depicted in FIG. 8, a gasket 86 is placed between the top plate 40 and the bottom plate 32. The gasket 86 is used to form a gas tight seal when the top plate 40 is coupled to the bottom plate 32.

When the contactor plate 60 is properly positioned in the porting insert 30, the channels 68 will be aligned with the channels 36 of the porting insert 30. This will allow the gas to flow through the channels 36 of the porting insert 30 to the contactor plate 60. The gas will enter the contactor plate 60 through the channels 68 of the contactor plate 60. The gas will then come in contact with the contactor devices 78. The gas will alter the temperature of the contactor devices 78 so that the temperature of the contactor devices 78 is approximately equal to that of the gas. As stated above, the contactor devices 78 are used to make contact between the integrated circuit positioned in the sockets 64 and a printed circuit board positioned on the testing equipment. Since the contactor devices 78 make contact with the integrated circuit to be tested, the contactor device 78 will alter the temperature of the integrated circuit to that of the contactor device 78. Thus, one is able to alter the temperature of the integrated circuit that is being tested by altering the temperature of the gas being inserted into the apparatus of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An apparatus to be mounted on a piece of testing equipment to allow environmental testing of an integrated circuit, comprising:

a contactor assembly for connecting the integrated circuit to the testing equipment and for altering a temperature of the integrated circuit; and a porting assembly coupled to the testing equipment and to the contactor assembly for transferring a gas to the contactor assembly to alter the temperature of the integrated circuit wherein the porting assembly comprises:
a porting tray coupled to the testing equipment; and
a porting insert coupled to the porting tray for coupling the contactor assembly to the porting tray, wherein the porting insert comprises:
a plate;
an opening within and through the plate; and
a plurality of channels running from an edge of the plate to the opening for transferring the gas to the contactor assembly to alter the temperature of the integrated circuit.

2. The apparatus of claim 1 wherein the contactor assembly comprises:
a contactor plate having an internal void area wherein the gas is transferred from the porting assembly into the internal void area; and
a plurality of contactors within the void area to make contact between the integrated circuit and the testing equipment and for altering the temperature of the integrated circuit.

3. The apparatus of claim 2 wherein the contactor plate comprises:
a top contactor plate having a plurality of sockets for holding the integrated circuit;
a bottom contactor plate coupled to the top plate;
a plurality of channels on at least one edge of the bottom plate wherein the plurality of channels are coupled to the porting assembly and the internal void area for transferring the gas from the porting assembly to the internal void area.

4. The apparatus of claim 2 further comprising a temperature sensor coupled to the contactor plate for monitoring a temperature within the internal void area.

5. The apparatus of claim 2 further comprising an alignment pin coupled to a top portion of the contactor plate for providing an optical alignment for the test equipment.

6. The apparatus of claim 3 wherein the contactor plate comprises an alignment device coupled to the top plate and the bottom plate for aligning the top plate with the bottom plate.

7. The apparatus of claim 3 further comprising:
a first set of openings located around an outer perimeter of the top contactor plate;
a second set of openings located around an outer perimeter of the bottom contactor plate; and
a plurality of connectors for coupling the top contactor plate to the bottom contactor plate when the first set of openings are in axial alignment with the second set of openings.

8. The apparatus of claim 1 wherein the porting tray comprises:
a platform;
a void area within the platform wherein the porting insert is coupled thereto; and
a plurality of channels running from an edge of the platform to the void area for transferring the gas to the contactor assembly to alter the temperature of the integrated circuit.

9. The apparatus of claim 8 wherein the plurality of channels are located on a top surface of the platform and run from the edge of the platform to the void area.

10. The apparatus of claim 9 further comprising a cover coupled to the platform for covering the plurality of channels.

11. The apparatus of claim 1 wherein the plate comprises:
a bottom plate having a bottom plate opening there through and having the plurality of channels running from an edge of the bottom plate to the bottom plate opening; and
a top plate having a top plate opening there through;
wherein the bottom plate opening and the top plate opening will form the opening in the porting insert when the top plate is coupled to the bottom plate.

12. The apparatus of claim 11 further comprising:
a first set of apertures on an outer perimeter of the top plate;
a second set of apertures on an outer perimeter of the bottom plate; and
a plurality of plate connectors for coupling the top plate to the bottom plate when the first set of apertures are in axial alignment with the second set of apertures.

13. The apparatus of claim 12 further comprising:
a third set of apertures located through the top plate and the bottom plate; and
a plurality porting assembly connectors for coupling the porting insert to the porting tray.

14. An apparatus to be mounted on a piece of testing equipment to allow environmental testing of an integrated circuit, comprising:
means for connecting the integrated circuit to the testing equipment and for altering a temperature of the integrated circuit; and
means coupled to the testing equipment and to the means for connecting for transferring a gas to the means for connecting to alter the temperature of the integrated circuit;
wherein the means for connecting further comprises:
a contactor plate having an internal void area wherein the gas is transferred from the means for transferring into the internal void area;
means within the void area for making contact between the integrated circuit and the testing equipment and for altering the temperature of the integrated circuit;
means coupled to a top surface of the contactor plate for holding the integrated circuit; and
a plurality of channels on at least one edge of the contactor plate wherein the plurality of channels are coupled to the means for transferring and the internal void area for transferring the gas from the means for transferring to the internal void area.

15. The apparatus of claim 14 wherein the means for transferring comprises:
a porting tray coupled to the testing equipment; and
means coupled to the porting tray for coupling the means for connecting to the porting tray.

16. The apparatus of claim 15 wherein the porting tray comprises:
a platform;
a void area within the platform wherein the porting insert is coupled thereto; and
a plurality of channels running from an edge of the platform to the void area for transferring the gas to the contactor assembly to alter the temperature of the integrated circuit.

17. The apparatus of claim 15 wherein the means for coupling comprises:

a plate;

an opening within and through the plate; and a plurality of channels running from an edge of the plate to the opening for transferring the gas to the means for connecting to alter the temperature of the integrated circuit.

18. A method for the environmental testing of an integrated circuit mounted on a test board comprising:

providing a contactor assembly for connecting the integrated circuit to the testing equipment and for altering a temperature of the integrated circuit;

providing a porting assembly coupled to the testing equipment and to the contactor assembly for transferring a gas to the contactor assembly to alter the temperature of the integrated circuit wherein the porting assembly comprises:

a porting tray coupled to the testing equipment; and a porting insert coupled to the porting tray for coupling the contactor assembly to the porting tray, wherein the porting insert comprises:

a plate;

an opening within and through the plate; and a plurality of channels running from an edge of the plate to the opening for transferring the gas to the contactor assembly to alter the temperature of the integrated circuit;

altering a temperature of the contactors to change a temperature of the integrated circuit; and testing the integrated circuit.

19. The method of claim 18 wherein the step of altering a temperature of the contactors further comprises the step of injecting a gas into the contactor assembly to alter the temperature of the contactors.

20. The method of claim 18 wherein the step of injecting a gas further comprises:

providing a porting assembly coupled to the testing equipment and to the contactor assembly; and injecting a gas into the porting assembly wherein the gas is transferred from the porting assembly to the contactor assembly.

* * * * *